United States Patent
Lin et al.

(10) Patent No.: US 8,217,861 B2
(45) Date of Patent: Jul. 10, 2012

(54) DRIVING CIRCUIT, AND A PIXEL CIRCUIT INCORPORATING THE SAME

(75) Inventors: Chih-Lung Lin, Tainan County (TW); Tsung-Ting Tsai, Tainan (TW)

(73) Assignee: National Cheng Kung University, Tainan (TW)

( * ) Notice: Subject to any disclaimer, the term of this patent is extended or adjusted under 35 U.S.C. 154(b) by 866 days.

(21) Appl. No.: 12/261,228

(22) Filed: Oct. 30, 2008

(65) Prior Publication Data
US 2010/0109718 A1 May 6, 2010

(51) Int. Cl.
*G09G 3/30* (2006.01)
(52) U.S. Cl. .............................. 345/76; 345/82; 345/204
(58) Field of Classification Search .......................... None
See application file for complete search history.

(56) References Cited

U.S. PATENT DOCUMENTS

| | | | | |
|---|---|---|---|---|
| 5,666,288 A * | 9/1997 | Jones et al. | ...................... | 716/55 |
| 6,043,638 A * | 3/2000 | Tobita | ........................... | 323/313 |
| 2001/0030561 A1 * | 10/2001 | Asano et al. | ................... | 327/170 |
| 2002/0153944 A1 * | 10/2002 | Uchiki et al. | .................. | 327/563 |
| 2004/0056605 A1 * | 3/2004 | Yoshida | ...................... | 315/169.3 |
| 2004/0090186 A1 * | 5/2004 | Yoshida et al. | ............. | 315/169.1 |
| 2004/0263436 A1 * | 12/2004 | Okuda | ............................. | 345/76 |
| 2005/0007357 A1 * | 1/2005 | Yamashita et al. | ............. | 345/204 |
| 2008/0106504 A1 * | 5/2008 | Wei et al. | ......................... | 345/82 |
| 2011/0285692 A1 * | 11/2011 | Uchino et al. | ................. | 345/212 |

* cited by examiner

*Primary Examiner* — Amare Mengistu
*Assistant Examiner* — Antonio Xavier
(74) *Attorney, Agent, or Firm* — Ladas & Parry LLP

(57) ABSTRACT

A driving circuit includes: a switch unit permitting transfer of a data signal when operating in an on state; a capacitor having a first end coupled to the switch unit, and a second end; a first transistor having a first terminal for coupling to a second voltage source, a second terminal coupled to the second end of the capacitor and to a load, and a control terminal coupled to the first end of the capacitor; and a second transistor having a first terminal coupled to the second end of the capacitor, a second terminal receiving a bias voltage, and a control terminal coupled to the first terminal of the second transistor.

20 Claims, 9 Drawing Sheets

DRIVING CIRCUIT, AND A PIXEL CIRCUIT INCORPORATING THE SAME

BACKGROUND OF THE INVENTION

1. Field of the Invention

The invention relates to a driving circuit, more particularly to a driving circuit for driving a load, and a pixel circuit that includes the driving circuit for driving an organic light emitting diode.

2. Description of the Related Art

Organic light emitting diode (OLED) displays are increasingly widely used due to the advantages of spontaneous emission of light, high luminance, fast reaction time, and wide viewing angle.

A conventional OLED display utilizes a plurality of pixel circuits that are arranged in matrices and that can emit light of different colors to achieve the function of displaying images. With reference to FIG. 1, each of the pixel circuits includes an organic light emitting diode (OLED) 1 and a first conventional driving circuit 2. The first conventional driving circuit 2 generates a driving current ($I_{DRIVE}$). The organic light emitting diode 1 is driven by the driving current ($I_{DRIVE}$) from the first conventional driving circuit 2 to emit light with a luminance that corresponds to a magnitude of the driving current ($I_{DRIVE}$).

The first conventional driving circuit 2 includes a first transistor 21, a second transistor 22, and a capacitor 23. Each of the first and second transistors 21, 22 is an N-type thin film transistor (TFT), and has a first terminal, a second terminal, and a control terminal.

The organic light emitting diode 1 has a cathode that is adapted to coupling to a first voltage source ($V_{SS}$). The control terminal of the first transistor 21 is adapted for receiving a scan signal (SCAN). The first terminal of the first transistor 21 is adapted for receiving a data signal ($V_{DATA}$). The second terminal of the first transistor 21 is coupled electrically to the control terminal of the second transistor 22. The first terminal of the second transistor 22 is adapted for coupling to a second voltage source ($V_{DD}$). The second terminal of the second transistor 22 is coupled electrically to the second terminal of the first transistor 21 via the capacitor 23, and is coupled electrically to an anode of the organic light emitting diode 1.

Shown in FIG. 2 are timing sequences of the scan signal (SCAN) and the data signal ($V_{DATA}$) for the first conventional driving circuit 2. When the scan signal (SCAN) is at a logic high level, the first transistor 21 is turned on, such that the data signal ($V_{DATA}$) is transferred to the control terminal of the second transistor 22, and such that the capacitor 23 stores energy from the data signal ($V_{DATA}$). On the other hand, when the scan signal (SCAN) is at a logic low level, the first transistor 21 is turned off. The second transistor 22 generates the driving current ($I_{DRIVE}$) with reference to the energy stored in the capacitor 23 according to the following formula:

$$I_{DRIVE} = \frac{1}{2}\mu_n C_{ox} \frac{W_{22}}{L_{22}}(V_{C,23} - V_{TH,22})^2$$

where ($W_{22}$) and ($L_{22}$) are width and length of the second transistor 22, ($V_{C,23}$) is the voltage across the capacitor 23, and ($V_{TH,22}$) is a threshold voltage for the second transistor 22.

Since the threshold voltages of the second transistors 22 for individual pixel circuits are not identical, the driving currents ($I_{DRIVE}$) generated by the pixel circuits differ from each other even with the same data signal ($V_{DATA}$), thereby resulting in luminance variations among the light emitted by the organic light emitting diodes 1.

With reference to FIG. 3, in order to diminish the effect of the threshold voltage differences on luminance variations, an article in IEEE ELECTRON DEVICE LETTERS Volume 25, Issue 10, October 2004, and entitled "*A New Voltage-Modulated AMOLED Pixel Design Compensation for Threshold Voltage Variation in Poly-Si TFTs*" discloses a pixel circuit that incorporates a second conventional driving circuit 2'. The second conventional driving circuit 2' includes a first transistor 24, a second transistor 25, a third transistor 26, a fourth transistor 27, a fifth transistor 28, and a capacitor 29. Each of the first to fifth transistors 24~28 is a P-type TFT, and includes a first terminal, a second terminal, and a control terminal. The organic light emitting diode 1 has a cathode that is adapted for coupling to a first voltage source ($V_{SS}$).

The control terminal of the first transistor 24 is adapted for receiving a scan signal (SCAN). The first terminal of the first transistor 24 is adapted for receiving a data signal ($V_{DATA}$). The second terminal of first transistor 24 is connected electrically to the first terminals of the second and third transistors 25, 26 and to the control terminal of the third transistor 26 (this node is hereinafter referred to as node (A)). The control terminal of the second transistor 25 is connected electrically to the second terminals of the second and third transistors 25, 26, to the control terminal of the fourth transistor 27, and to one end of the capacitor 29 (this node is hereinafter referred to as node (B)). The first terminal of the fourth transistor 27 is connected electrically to the other end of the capacitor 29, and is adapted for coupling to a second voltage source ($V_{DD}$). The second terminal of the fourth transistor 27 is connected electrically to the first terminal of the fifth transistor 28. The control terminal of the fifth transistor 28 is adapted for receiving a control signal (CTRL). The second terminal of the fifth transistor 28 is connected electrically to an anode of the organic light emitting diode 1.

Shown in FIG. 4 are timing sequences of the scan signal (SCAN), the data signal ($V_{DATA}$), and the control signal (CTRL) for the second conventional driving circuit 2'. When the scan signal (SCAN) is at a logic low level, and the control signal (CTRL) is at a logic high level, the first transistor 24 is turned on, and the fifth transistor 28 is turned off, such that the data signal ($V_{DATA}$) is transferred to the node (A). When the data signal ($V_{DATA}$) is at a logic low level, the voltage at the node (B) is pulled down by the third transistor 26 until the voltage at the node (B) is equal to the data signal ($V_{DATA}$) plus the absolute value of the threshold voltage for the third transistor 26. In this situation, the fourth transistor 27 does not generate the driving current ($I_{DRIVE}$).

When the scan signal (SCAN) is at a logic low level, and the control signal (CTRL) is at a logic low level, the first transistor 24 is turned on, and the fifth transistor 28 is turned on, such that the data signal ($V_{DATA}$), which is at a logic high level, is transferred to the node (A). At this time, since the data signal ($V_{DATA}$) is at a logic high level, the voltage at the node (B) is pulled up through the second transistor 25 until the voltage at node (B) is equal to the data signal ($V_{DATA}$) subtracted by the absolute value of the threshold voltage for the second transistor 25. In this situation, the fourth transistor 27 generates the driving current ($I_{DRIVE}$) with reference to the voltage across the capacitor 29 according to the following formula:

$$I_{DRIVE} = \frac{1}{2}\mu_P C_{ox} \frac{W_{27}}{L_{27}}(V_{C,29} - |V_{TH,27}|)^2$$

$$= \frac{1}{2}\mu_P C_{ox} \frac{W_{27}}{L_{27}}(V_{DD} - V_B - |V_{TH,27}|)^2$$

$$= \frac{1}{2}\mu_P C_{ox} \frac{W_{27}}{L_{27}}(V_{DD} - V_{DATA} + |V_{TH,25}| - |V_{TH,27}|)^2$$

where ($W_{27}$) and ($L_{27}$) are respectively width and length of the fourth transistor 27, ($V_{C,29}$) is the voltage across the capacitor 29, ($V_B$) is the voltage at node (B), ($V_{TH,27}$) is the threshold voltage for the fourth transistor 27, and ($V_{TH,25}$) is the threshold voltage for the second transistor 25. Since the second and fourth transistors 25, 27 are very close to each other in location, the threshold voltages thereof can be assumed to be identical. Therefore, the formula can be simplified and rewritten as follows.

$$I_{DRIVE} = \frac{1}{2}\mu_P C_{ox} \frac{W_{27}}{L_{27}}(V_{DD} - V_{DATA})^2$$

When the scan signal (SCAN) is at a logic high level, and when the control signal (CTRL) is at the logic low level, the first transistor 24 is turned off, and the fifth transistor 28 is turned on. The fourth transistor 27 generates the driving current ($I_{DRIVE}$) according to the voltage across the capacitor 29.

Since the effect on the driving current ($I_{DRIVE}$) due to the threshold voltage of the fourth transistor 27 for each of the pixel circuits is canceled out by that due to the threshold voltage of the second transistor 25, the driving currents ($I_{DRIVE}$) generated by the pixel circuits are identical to each other with the same data signal ($V_{DATA}$), thereby resulting in identical luminance among the light emitted by the organic light emitting diodes 1.

However, although the second conventional driving circuit 2' is capable of reducing the effect of the threshold voltage differences on the luminance variations of the organic light emitting diodes 1, three more transistors are required in the second conventional driving circuit 2' as compared to the first conventional driving circuit 2 (as shown in FIG. 1), thereby reducing an aperture ratio (i.e., a ratio of coverage area of effective illuminating display region) of the OLED display utilizing the second conventional driving circuit 2'. Consequently, utilization efficiency of the light is diminished.

SUMMARY OF THE INVENTION

Therefore, the object of the present invention is to provide a driving circuit that can minimize the effect of threshold voltage variations, and a pixel circuit incorporating the same.

According to one aspect of the present invention, there is provided a pixel circuit that includes an organic light emitting diode and a driving circuit. The organic light emitting diode has an anode that receives a driving current, and a cathode that is adapted for coupling to a first voltage source. The driving circuit includes a switch unit, a capacitor, a first transistor, and a second transistor. The switch unit is operable in one of an on state and an off state according to a scan signal, and is adapted for permitting transfer of a data signal when operating in the on state. The capacitor has a first end that is coupled electrically to the switch unit, and a second end. The first transistor has a first terminal that is adapted for coupling to a second voltage source, a second terminal that is coupled electrically to the second end of the capacitor and to the anode of the organic light emitting diode, and a control terminal that is coupled electrically to the first end of the capacitor. The second transistor has a first terminal that is coupled electrically to the second end of the capacitor, a second terminal that is adapted for receiving a bias voltage, and a control terminal that is coupled electrically to the first terminal of the second transistor.

According to another aspect of the present invention, there is provided a pixel circuit that includes an organic light emitting diode and a driving circuit. The organic light emitting diode has an anode that receives a driving current, and a cathode that is adapted for coupling to a first voltage source. The driving circuit includes a switch unit, a capacitor, a first transistor, and a second transistor. The switch unit is operable in one of an on state and an off state according to a scan signal, and is adapted for permitting transfer of a data signal when operating in the on state. The capacitor has a first end that is coupled electrically to the switch unit, and a second end. The first transistor has a first terminal that is adapted for coupling to a second voltage source, and that is coupled electrically to the second end of the capacitor, a second terminal that is coupled electrically to the anode of the organic light emitting diode, and a control terminal that is coupled electrically to the first end of the capacitor. The second transistor has a first terminal that is coupled electrically to the second terminal of the first transistor, a second terminal that is adapted for receiving a bias voltage, and a control terminal that is coupled electrically to the second terminal of the second transistor.

According to yet another aspect of the present invention, there is provided a driving circuit for driving a load. The driving circuit includes a switch unit, a capacitor, a first transistor and a second transistor. The switch unit is operable in one of an on state and an off state according to a scan signal, and is adapted for permitting transfer of a data signal when operating in the on state. The capacitor has a first end that is coupled electrically to the switch unit, and a second end. The first transistor has a first terminal that is adapted for coupling to a second voltage source, a second terminal that is coupled electrically to the second end of the capacitor and that is adapted to be coupled electrically to the load, and a control terminal that is coupled electrically to the first end of the capacitor. The second transistor has a first terminal that is coupled electrically to the second end of the capacitor, a second terminal that is adapted for receiving a bias voltage, and a control terminal that is coupled electrically to the first terminal of the second transistor.

According to still another aspect of the present invention, there is provided a driving circuit for driving a load. The driving circuit includes a switch unit, a capacitor, a first transistor, and a second transistor. The switch unit is operable in one of an on state and an off state according to a scan signal, and is adapted for permitting transfer of a data signal when operating in the on state. The capacitor has a first end that is coupled electrically to the switch unit, and a second end. The first transistor has a first terminal that is adapted for coupling to a second voltage source, and that is coupled electrically to the second end of the capacitor, a second terminal that is adapted to be coupled electrically to the load, and a control terminal that is coupled electrically to the first end of the capacitor. The second transistor has a first terminal that is coupled electrically to the second terminal of the first transistor, a second terminal that is adapted for receiving a bias voltage, and a control terminal that is coupled electrically to the second terminal of the second transistor.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 5:
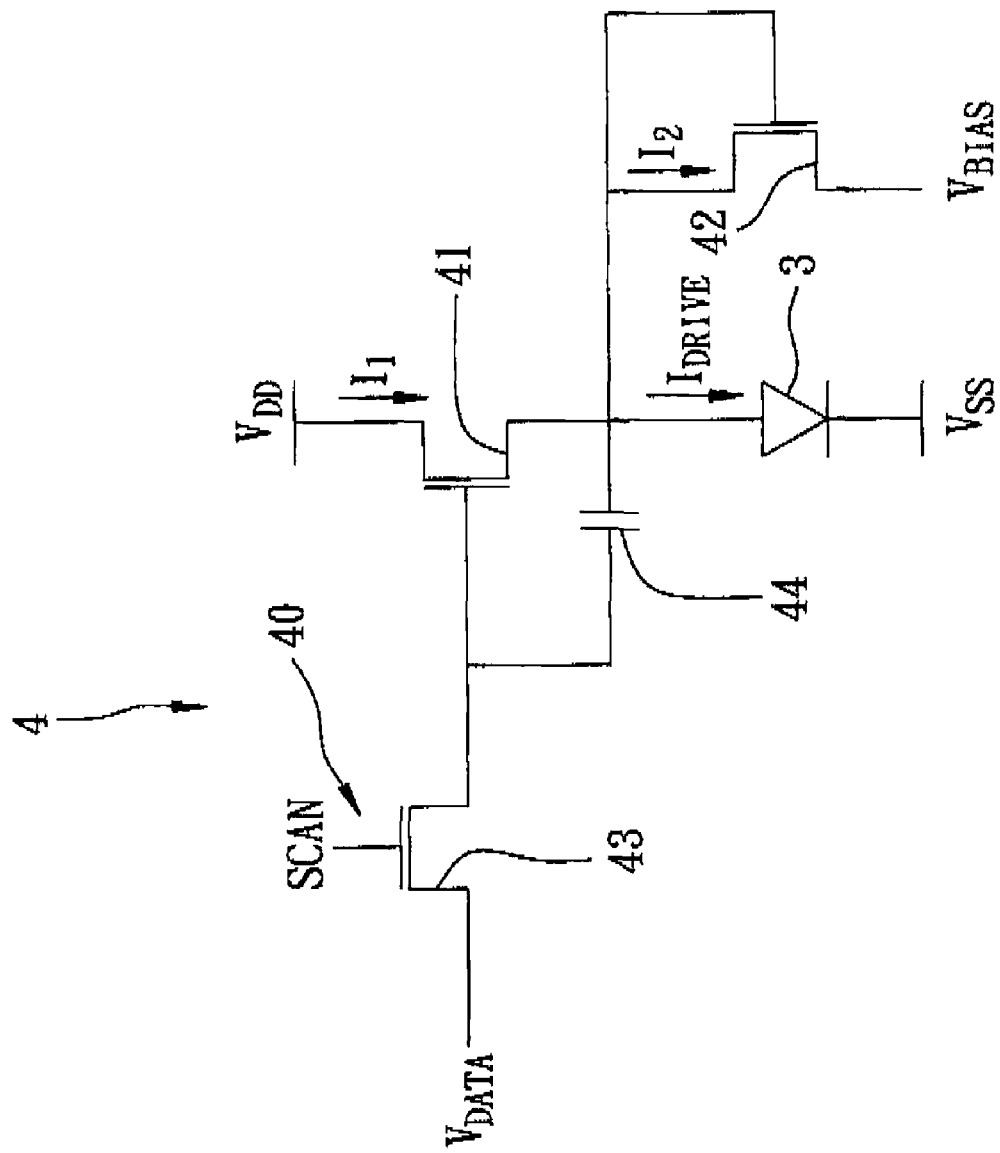
FIG. 5 is a circuit diagram of the first preferred embodiment of a pixel circuit according to the present invention.

Referring to FIG. 5, the first preferred embodiment of a pixel circuit according to this invention includes an organic light emitting diode (OLED) 3 and a driving circuit 4. The organic light emitting diode 3 has an anode that receives a driving current ($I_{DRIVE}$), and a cathode that is adapted for coupling to a first voltage source ($V_{SS}$). The driving circuit 4 includes a switch unit 40, a capacitor 44, a first transistor 41, and a second transistor 42.

The switch unit 40 is operable in one of an on state and an off state according to a scan signal (SCAN), and is adapted for permitting transfer of a data signal ($V_{DATA}$) when operating in the on state.

The capacitor 44 has a first end that is coupled electrically to the switch unit 40, and a second end.

The first transistor 41 has a first terminal that is adapted for coupling to a second voltage source ($V_{DD}$), a second terminal that is coupled electrically to the second end of the capacitor 44 and to the anode of the organic light emitting diode 3, and a control terminal that is coupled electrically to the first end of the capacitor 44.

The second transistor 42 has a first terminal that is coupled electrically to the second end of the capacitor 44, a second terminal that is adapted for receiving a bias voltage ($V_{BIAS}$), and a control terminal that is coupled electrically to the first terminal of the second transistor 42.

The capacitor 44 stores energy from the data signal ($V_{DATA}$) when the switch unit 40 operates in the on state. The first transistor 41 generates a first current ($I_1$) according to the energy stored in the capacitor 44. The driving current ($I_{DRIVE}$) is drawn from the first current ($I_1$) for driving operation of the organic light emitting diode 3.

In this embodiment, the switch unit 40 includes a third transistor 43 having a first terminal that is adapted for receiving the data signal ($V_{DATA}$), a second terminal that is coupled electrically to the control terminal of the first transistor 41, and a control terminal that is adapted for receiving the scan signal (SCAN). Each of the first, second and third transistors 41, 42, 43 is an N-type thin film transistor (TFT).

Figure 6:
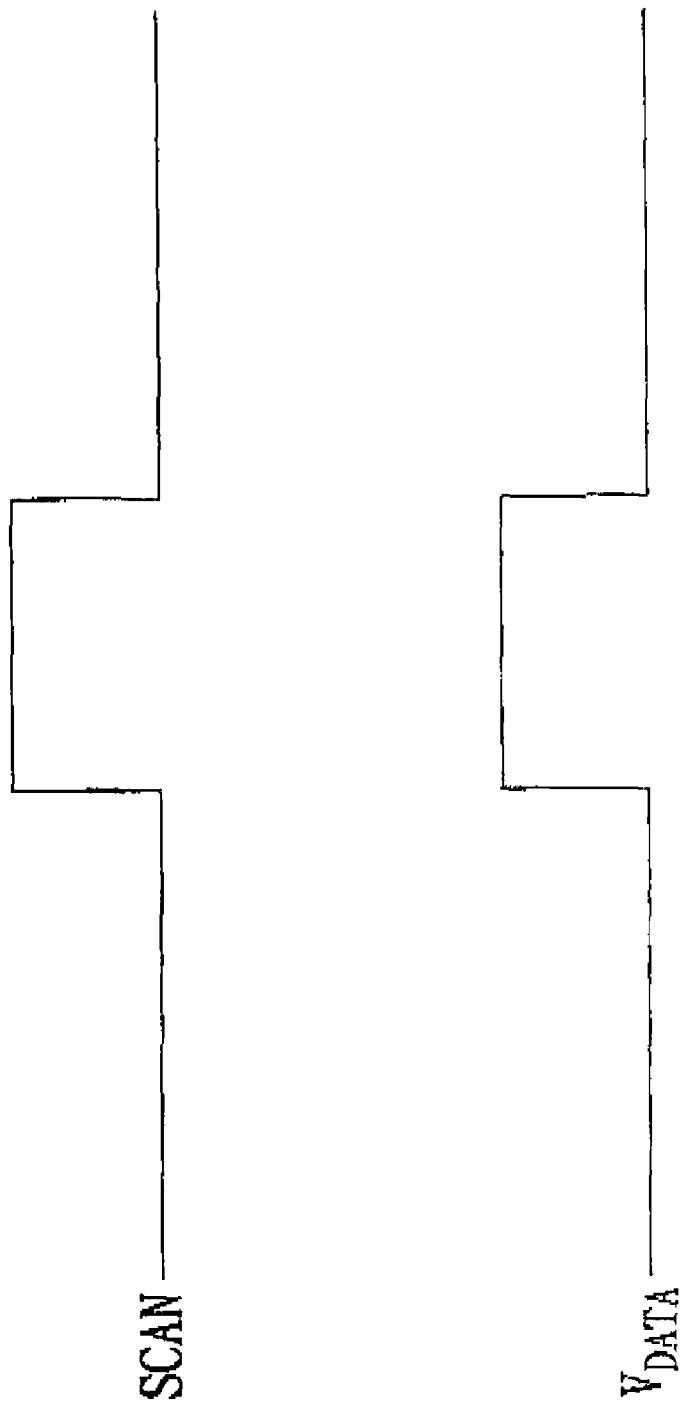
FIG. 6 illustrates timing sequences of SCAN and $V_{DATA}$ signals for a driving circuit of the first preferred embodiment.

Shown in FIG. 6 are timing sequences of the scan signal (SCAN) and the data signal ($V_{DATA}$) for the driving circuit 4. When the scan signal (SCAN) is at a logic high level, the third transistor 43 is turned on (i.e., the switch unit 40 operates in the on state), thereby permitting transfer of the data signal ($V_{DATA}$) to the control terminal of the first transistor 41 such that the capacitor 44 stores energy from the data signal ($V_{DATA}$). When the scan signal (SCAN) is at a low logic level, the third transistor 43 is turned off (i.e., the switch unit 40 operates in the off state), and the first transistor 41 generates the first current ($I_1$) according to the energy stored in the capacitor 44. The first current ($I_1$) is then divided into a second current ($I_2$) flowing to the second transistor 42 and the driving current ($I_{DRIVE}$) that drives the operation of the organic light emitting diode 3. It should be noted herein that the bias voltage ($V_{BIAS}$) is of a value such that the second transistor 22 operates in the saturation region.

The first current ($I_1$), the second current ($I_2$), and the driving current ($I_{DRIVE}$) are respectively generated according to the following formulae:

$$I_1 = \frac{1}{2}\mu_n C_{ox} \frac{W_{41}}{L_{41}}(V_{GS,41} - V_{TH,41})^2$$

$$I_2 = \frac{1}{2}\mu_n C_{ox} \frac{W_{42}}{L_{42}}(V_{GS,42} - V_{TH,42})^2$$

$$I_{DRIVE} = I_1 - I_2$$

where $W_{41}$ and $L_{41}$ are respectively a width and a length of the first transistor 41, $V_{GS,41}$ is a voltage difference between the control terminal and the second terminal of the first transistor 41, $V_{TH,41}$ is a threshold voltage for the first transistor 41, $W_{42}$ and $L_{42}$ are respectively a width and a length of the second transistor 42, $V_{GS,42}$ is a voltage difference between the control terminal and the second terminal of the second transistor 42, and $V_{TH,42}$ is a threshold voltage for the second transistor 42.

The following formula can be used to estimate an offset to the driving current ($I_{DRIVE}$):

$$\frac{\partial I_{DRIVE}}{\partial V_{TH}} = -\mu_n C_{ox} \frac{W_{41}}{L_{41}}(V_{GS,41} - V_{TH,41}) + \mu_n C_{ox} \frac{W_{42}}{L_{42}}(V_{GS,42} - V_{TH,42})$$

$$= -g_{m,41} + g_{m,42}$$

where $g_{m,41}$ is a mutual conductance of the first transistor 41, and $g_{m,42}$ is a mutual conductance of the second transistor 42.

Therefore, by making the first and second transistors 41, 42 to have substantially identical mutual conductances $g_{m,41}$, $g_{m,42}$, the effect of variations in the threshold voltage of the first transistor 41 on the driving current ($I_{DRIVE}$) can be eliminated. This can be achieved by finding suitable width-to-length ratios for the first and second transistors 41, 42. As a result, the driving circuits 4 of different pixel circuits of the present invention can generate substantially identical driving currents ($I_{DRIVE}$) when the data signal ($V_{DATA}$) supplied thereto is the same, thereby resulting in substantially identical luminance intensity of light emitted by the organic light emitting diodes 3.

Figure 7:
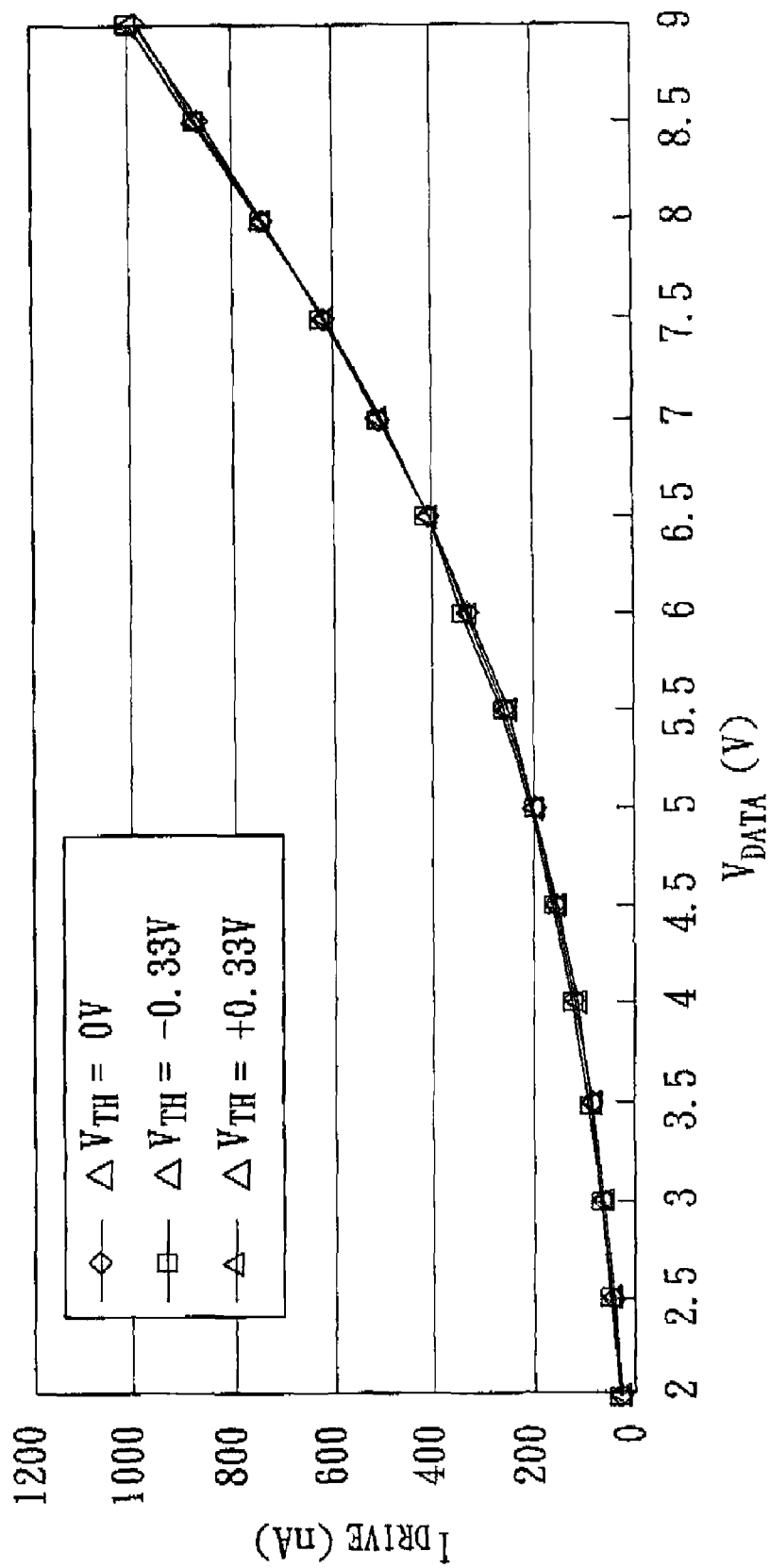
FIG. 7 shows simulation results for driving currents generated by the driving circuit of the first preferred embodiment under three different conditions.

Assuming that the first voltage source ($V_{SS}$) is −6V, the second voltage source ($V_{DD}$) is 9V, the logic high level of the scan signal (SCAN) is 15V, the logic low level of the scan signal (SCAN) is −15V, the data signal ($V_{DATA}$) has a voltage range of between 2V and 9V, the bias voltage ($V_{BIAS}$) is −3V, the width-to-length ratio ($W_{41}/L_{41}$) of the first transistor 41 is 5 μm/9 μm, the width-to-length ratio ($W_{42}/L_{42}$) of the second transistor 42 is 7 μm/9 μm, the width-to-length ratio ($W_{43}/L_{43}$) of the third transistor 43 is 9 μm/9 μm, and the capacitance of the capacitor 44 is 0.5 pF, FIG. 7 shows simulation results for the driving currents ($I_{DRIVE}$) under three different conditions, i.e., when the threshold voltage drifts for the first, second and third transistors 41, 42, 43 are all 0 V, when the threshold voltage drifts for the first, second and third transistors 41, 42, 43 are all −0.33V, and when the threshold voltage drifts for the first, second and third transistors 41, 42, 43 are all +0.33V. As can be seen from FIG. 7, the driving Currents ($I_{DRIVE}$) for the different conditions, which are the differences that would exist among different pixel circuits, are substantially identical.

It should be noted herein that other than the organic light emitting diode 3, the driving circuit 4 can also be used for driving other loads. Further, instead of the N-type thin film transistor, each of the first, second and third transistors 41, 42, 43 may be an N-type metal oxide semiconductor (NMOS) in other embodiments of the present invention.

Figure 8:
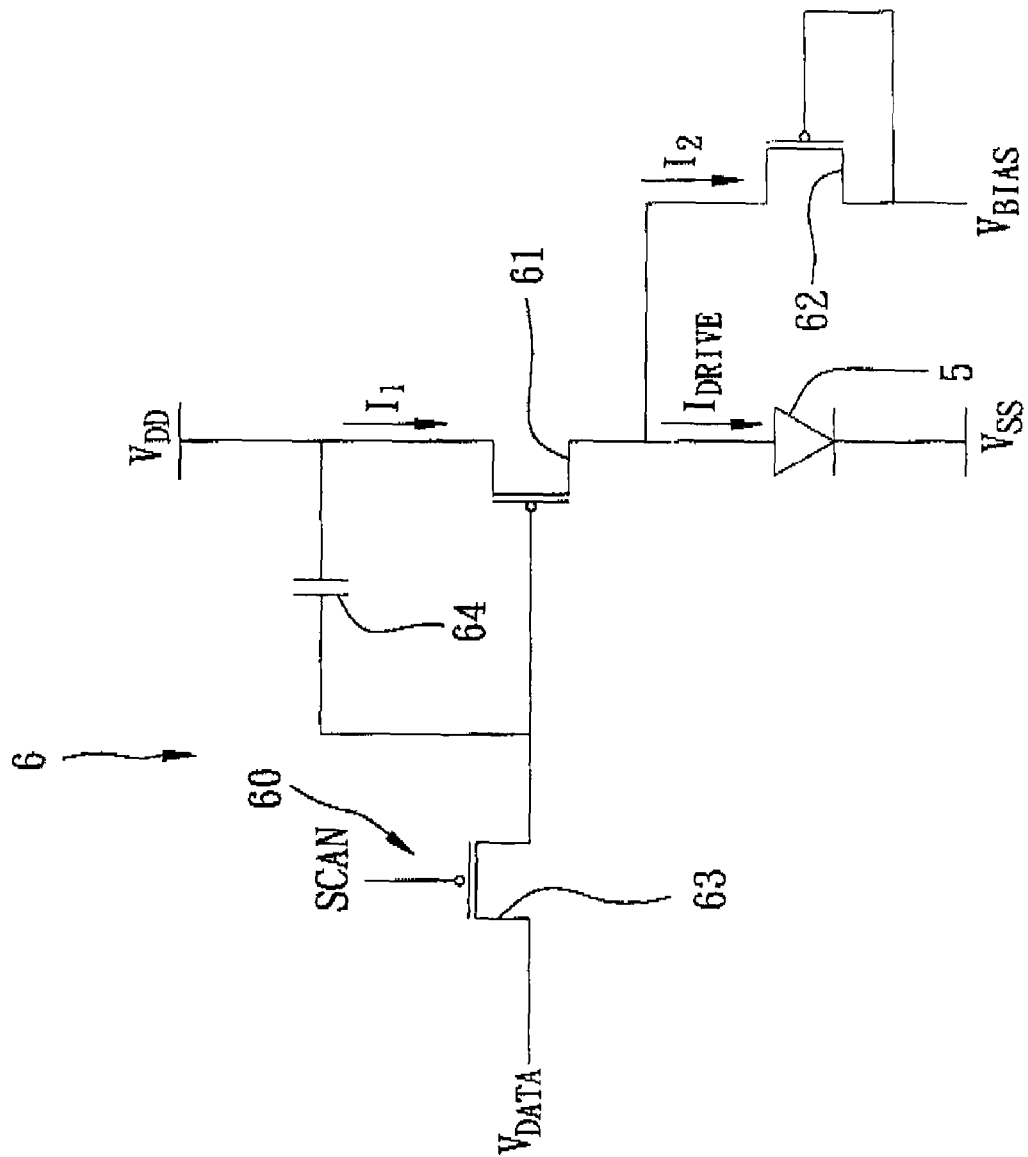
FIG. 8 is a circuit diagram of the second preferred embodiment of a pixel circuit according to the present invention.

With reference to FIG. 8, the second preferred embodiment of a pixel circuit according to this invention includes an organic light emitting diode 5 and a driving circuit 6. The organic light emitting diode 5 has an anode that receives a driving current ($I_{DRIVE}$), and a cathode that is adapted for coupling to a first voltage source ($V_{SS}$). The driving circuit 6 includes a switch unit 60, a capacitor 64, a first transistor 61, and a second transistor 62.

The switch unit 60 is operable in one of an on state and an off state according to a scan signal (SCAN), and is adapted for permitting transfer of a data signal ($V_{DATA}$) when operating in the on state.

The capacitor 64 has a first end that is coupled electrically to the switch unit 60, and a second end.

The first transistor 61 has a first terminal that is adapted for coupling to a second voltage source ($V_{DD}$), and that is coupled electrically to the second end of the capacitor 64, a second terminal that is coupled electrically to the anode of the organic light emitting diode 5, and a control terminal that is coupled electrically to the first end of the capacitor 64.

The second transistor 62 has a first terminal that is coupled electrically to the second terminal of the first transistor 61, a second terminal that is adapted for receiving a bias voltage ($V_{BIAS}$), and a control terminal that is coupled electrically to the second terminal of the second transistor 62.

The capacitor 64 stores energy from the data signal ($V_{DATA}$) when the switch unit 60 operates in the on state. The first transistor 61 generates a first current ($I_1$) according to the energy stored in the capacitor 64. The driving current ($I_{DRIVE}$) is drawn from the first current ($I_1$) for driving operation of the organic light emitting diode 5.

In this embodiment, the switch unit 60 includes a third transistor 63 having a first terminal that is adapted for receiving the data signal ($V_{DATA}$), a second terminal that is coupled electrically to the control terminal of the first transistor 61, and a control terminal that is adapted for receiving the scan signal (SCAN). Each of the first, second and third transistors 61, 62, 63 is a P-type thin film transistor (TFT).

Figure 9:
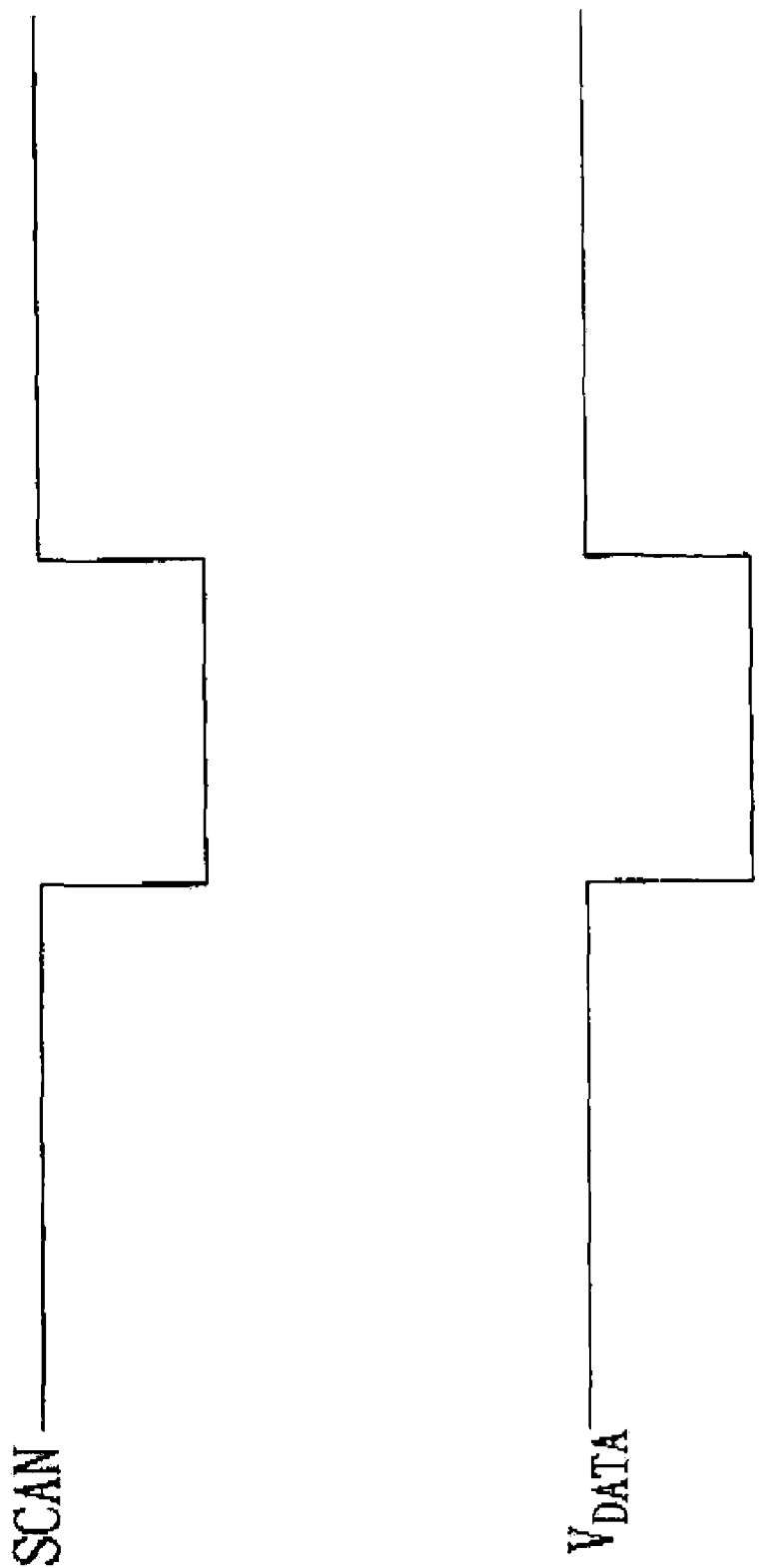
FIG. 9 illustrates timing sequences of SCAN and $V_{DATA}$ signals for a driving circuit of the second preferred embodiment.

Shown in FIG. 9 are timing sequences of the scan signal (SCAN) and the data signal ($V_{DATA}$) for the driving circuit 6. When the scan signal (SCAN) is at a logic low level, the third transistor 63 is turned on (i.e., the switch unit 60 operates in the on state), thereby permitting transfer of the data signal ($V_{DATA}$) to the control terminal of the first transistor 61 such that the capacitor 64 stores energy from the data signal ($V_{DATA}$). When the scan signal (SCAN) is at a logic high level, the third transistor 63 is turned off (i.e., the switch unit 60 operates in the off state) and the first transistor 61 generates the first current ($I_1$) according to the energy stored in the capacitor 64. The first current ($I_1$) is then divided into a second current ($I_2$) flowing to the second transistor 62 and the driving current ($I_{DRIVE}$) that drives the operation of the organic light emitting diode 5. It should be noted herein that the bias voltage ($V_{BIAS}$) is of a value such that the second transistor 62 operates in the saturation region.

By using suitable width-to-length ratios for the first and second transistors 61, 62 so as to make mutual conductances $g_{m,61}$, $g_{m,62}$ of the first and second transistors 61, 62 substantially identical, the effect of variations in the threshold voltage of the first transistor 61 on the driving current ($I_{DRIVE}$) can be eliminated. As a result, the driving circuits 6 of different pixel circuits of the present invention can generate substantially identical driving currents ($I_{DRIVE}$) when the data signal ($V_{DATA}$) supplied thereto is the same, thereby resulting in substantially identical luminance intensity of light emitted by the organic light emitting diodes 5.

It should be noted herein that other than the organic light emitting diode 5, the driving circuit 6 can also be used for driving other loads. Further, instead of the P-type thin film transistor, each of the first, second and third transistors 61, 62, 63 may be a P-type metal oxide semiconductor (PMOS) in other embodiments of the present invention.

Figure 1:
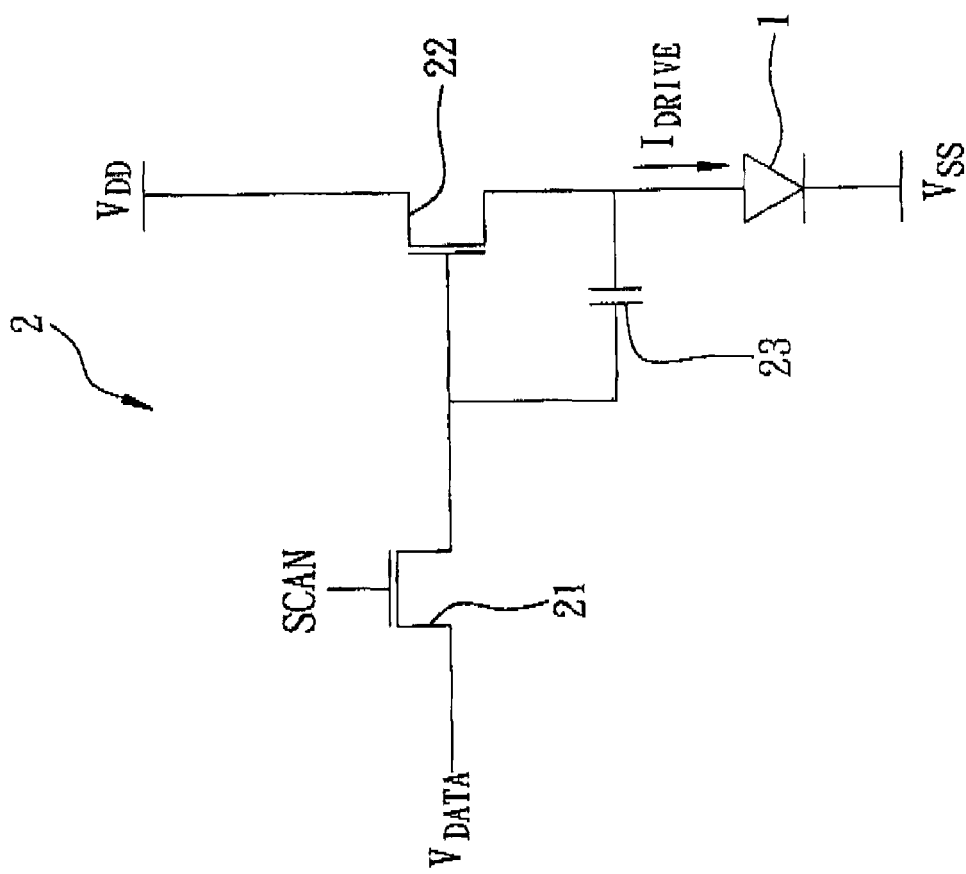
FIG. 1 is a circuit diagram of a pixel circuit for a conventional OLED display.
Figure 2:
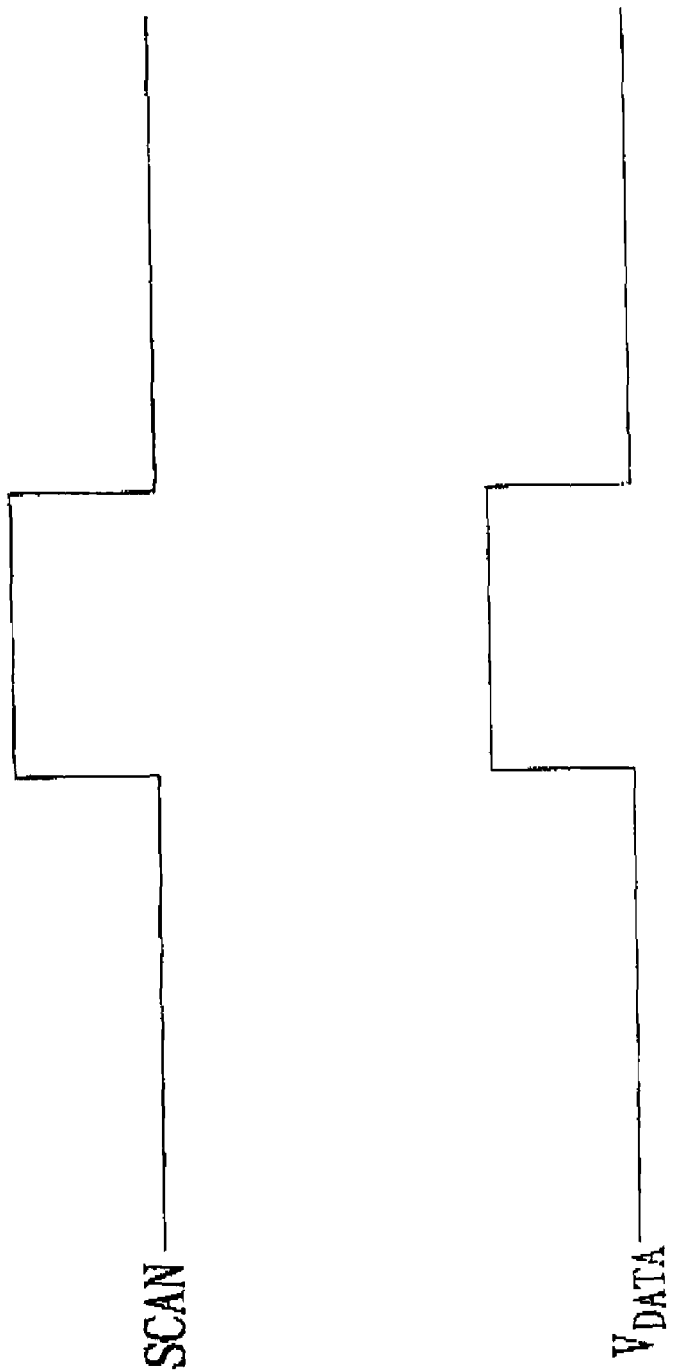
FIG. 2 illustrates timing sequences of SCAN and $V_{DATA}$ signals for a first conventional driving circuit of the pixel circuit of FIG. 1.
Figure 3:
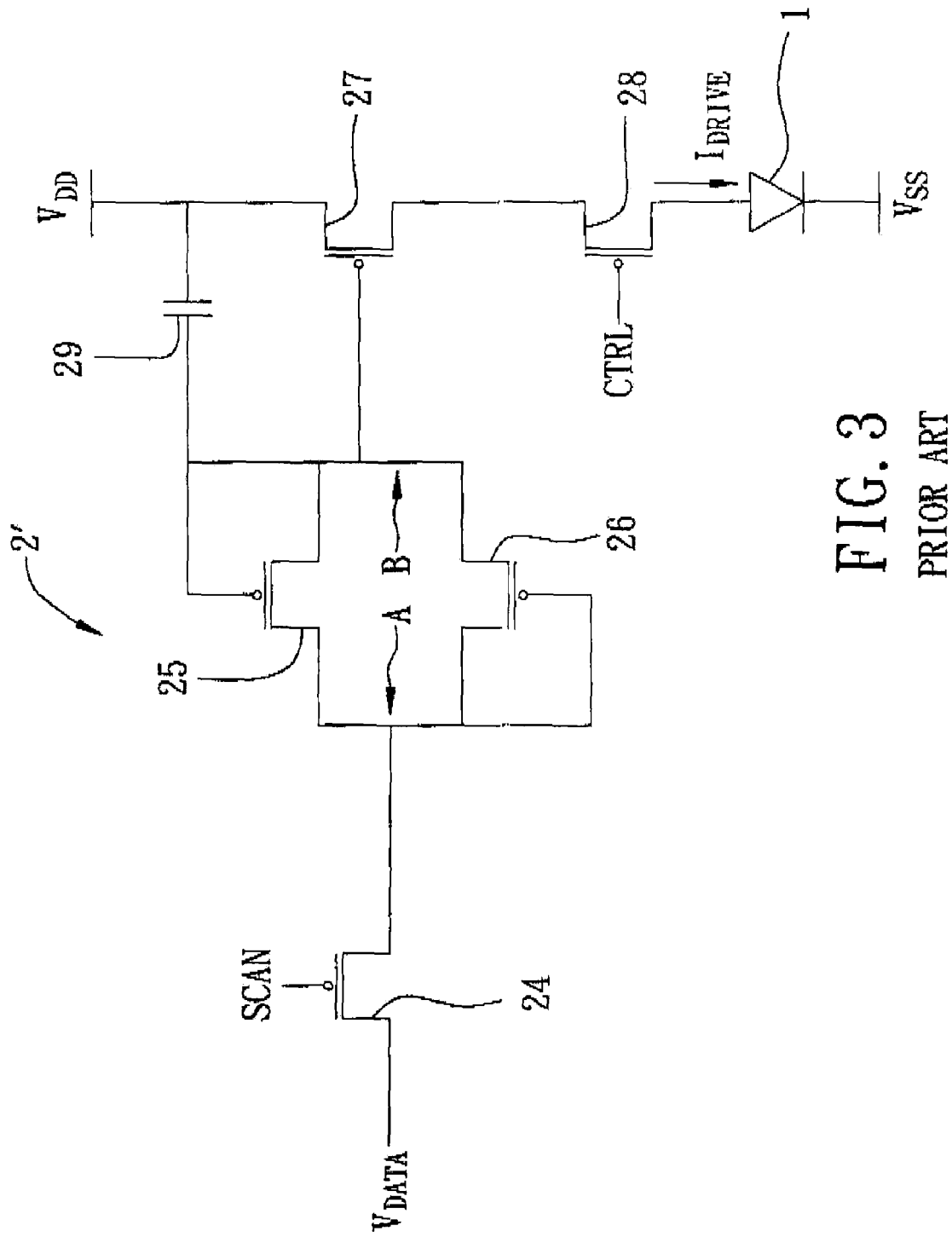
FIG. 3 is a circuit diagram of a pixel circuit incorporating a second conventional driving circuit.
Figure 4:
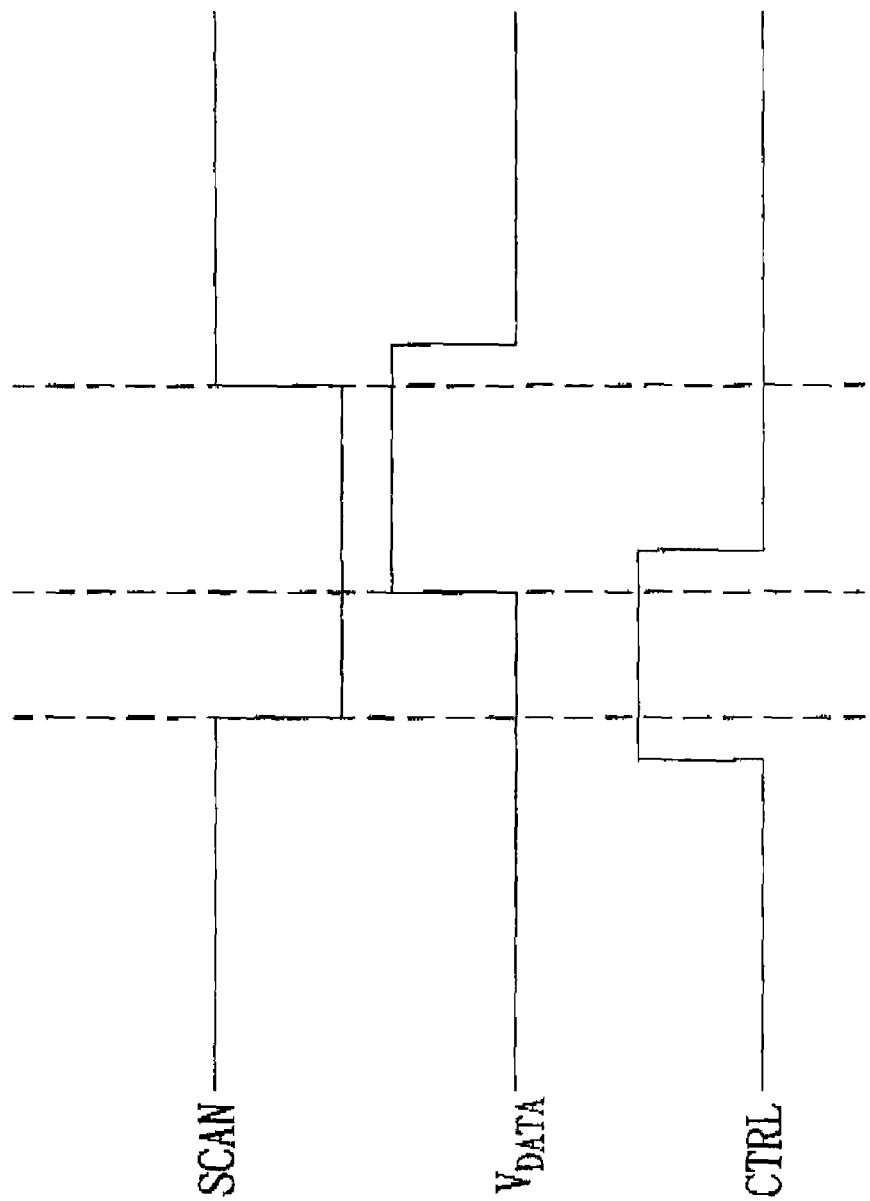
FIG. 4 illustrates timing sequences for the pixel circuit of FIG. 3.

In summary, the present invention utilizes the second transistor 42, 62 to compensate for the effect of threshold voltage variation of the first transistor 41, 61 on the driving current ($I_{DRIVE}$), such that the driving currents ($I_{DRIVE}$) generated by different driving circuits 4, 6 for driving different organic light emitting diodes 3, 5 are substantially identical, thereby resulting in substantially identical luminance among the organic light emitting diodes 3, 5. Furthermore, the total number of transistors used in the pixel circuit of the present invention that incorporates the driving circuit 4, 6 is fewer than that of the second conventional driving circuit 2' (as shown in FIG. 3) by two.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A pixel circuit comprising:
    an organic light emitting diode having an anode that receives a driving current, and a cathode that is adapted for coupling to a first voltage source; and
    a driving circuit including:
        a switch unit that is operable in one of an on state and an off state according to a scan signal, and that is adapted for permitting transfer of a data signal when operating in the on state;
        a capacitor having a first end that is coupled electrically to said switch unit, and a second end;
        a first transistor having a first terminal that is adapted for coupling to a second voltage source, a second terminal that is coupled electrically to said second end of said capacitor and to said anode of said organic light emitting diode, and a control terminal that is coupled electrically to said first end of said capacitor; and
        a second transistor having a first terminal that is coupled directly and electrically to said second end of said capacitor and to said anode of said organic light emitting diode, a second terminal that is adapted for receiving a bias voltage having a value such that said second transistor operates in the saturation region, and a control terminal that is coupled directly and electrically to said first terminal of said second transistor.

2. The pixel circuit as claimed in claim 1, wherein each of said first and second transistors is one of an N-type thin film transistor and an N-type metal oxide semiconductor.

3. The pixel circuit as claimed in claim 1, wherein said switch unit includes a third transistor having a first terminal that is adapted for receiving the data signal, a second terminal that is coupled electrically to said control terminal of said first transistor, and a control terminal that is adapted for receiving the scan signal.

4. The pixel circuit as claimed in claim 3, wherein each of said first, second and third transistors is one of an N-type thin film transistor and an N-type metal oxide semiconductor.

5. The pixel circuit as claimed in claim 1, wherein said first and second transistors have substantially identical mutual conductances.

6. A pixel circuit comprising:
   an organic light emitting diode having an anode that receives a driving current, and a cathode that is adapted for coupling to a first voltage source; and
   a driving circuit including:
      a switch unit that is operable in one of an on state and an off state according to a scan signal, and that is adapted for permitting transfer of a data signal when operating in the one state;
      a capacitor having a first end that is coupled electrically to said switch unit, and a second end;
      a first transistor having a first terminal that is adapted for coupling to a second voltage source, and that is coupled electrically to said second end of said capacitor, a second terminal that is coupled electrically to said anode of said organic light emitting diode, and a control terminal that is coupled electrically to said first end of said capacitor; and
      a second transistor having a first terminal that is coupled directly and electrically to said second end of said capacitor and to said anode of said organic light emitting diode, a second terminal that is adapted for receiving a bias voltage having a value such that said second transistor operates in the saturation region, and a control terminal that is coupled directly and electrically to said first terminal of said second transistor.

7. The pixel circuit as claimed in claim 6, wherein each of said first and second transistors is one of P-type thin film transistor and a P-type metal oxide semiconductor.

8. The pixel circuit as claimed in claim 6, wherein said switch unit includes a third transistor having a first terminal that is adapted for receiving the data signal, a second terminal that is coupled electrically to said control terminal of said first transistor, and a control terminal that is adapted for receiving the scan signal.

9. The pixel circuit as claimed in claim 8, wherein each of said first, second and third transistors is one of a P-type thin film transistor and a P-type metal oxide semiconductor.

10. The pixel circuit as claimed in claim 6, wherein said first and second transistors have substantially identical mutual conductances.

11. A driving circuit for driving a load, comprising:
   a switch unit that is operable in one of an on state and an off state according to a scan signal, and that is adapted for permitting transfer of a data signal when operating in the on state;
   a capacitor having a first end that is coupled electrically to said switch unit, and second end;
   a first transistor having a first terminal that is adapted for coupling to a second voltage source, a second terminal that is coupled electrically to said second end of said capacitor and that is adapted to be coupled electrically to the load, and a control terminal that is coupled electrically to said first end of said capacitor; and
   a second transistor having a first terminal that is coupled directly and electrically to said second end of said capacitor and to said anode of said organic light emitting diode, a second terminal that is adapted for receiving a bias voltage having a value such that said second transistor operates in the saturation region, and a control terminal that is coupled directly and electrically to said first terminal of said second transistor.

12. The driving circuit as claimed in claim 11, wherein each of said first and second transistors is one of an N-type thin film transistor and an N-type metal oxide semiconductor.

13. The driving circuit as claimed in claim 11, wherein said switch unit includes a third transistor having a first terminal that is adapted for receiving the data signal, a second terminal that is coupled electrically to said control terminal of said first transistor, and a control terminal that is adapted for receiving the scan signal.

14. The driving circuit as claimed in claim 13, wherein each of said first, second and third transistors is one of an N-type thin film transistor and an N-type metal oxide semiconductor.

15. The driving circuit as claimed in claim 11, wherein said first and second transistors have substantially identical mutual conductances.

16. A driving circuit for driving a load, comprising:
   a switch unit that is operable in one of an on state and an off state according to a scan signal, and that is adapted for permitting transfer of a data signal when operating in the on state;
   a capacitor having a first end that is coupled electrically to said switch unit, and a second end;
   a first transistor having a first terminal that is adapted for coupling to a second voltage source, and that is coupled electrically to said second end of said capacitor, a second terminal that is adapted to be coupled electrically to the load, and a control terminal that is coupled electrically to said first end of said capacitor; and
   a second transistor having a first terminal that is coupled directly and electrically to said second end of said capacitor and to said anode of said organic light emitting diode, a second terminal that is adapted for receiving a bias voltage having a value such that said second transistor operates in the saturation region, and a control terminal that is coupled directly and electrically to said first terminal of said second transistor.

17. The driving circuit as claimed in claim 16, wherein each of said first and second transistors is one of a P-type thin film transistor and a P-type metal oxide semiconductor.

18. The driving circuit as claimed in claim 16, wherein said switch unit includes a third transistor having a first terminal that is adapted for receiving the data signal, a second terminal that is coupled electrically to said control terminal of said first transistor, and a control terminal that is adapted for receiving the scan signal.

19. The driving circuit as claimed in claim 18, wherein each of said first, second and third transistors is one of a P-type thin film transistor and P-type metal oxide semiconductor.

20. The driving circuit as claimed in claim 16, wherein said first and second transistors have substantially identical mutual conductances.

* * * * *